United States Patent
Kameyama

(10) Patent No.: US 8,187,949 B2
(45) Date of Patent: May 29, 2012

(54) SEMICONDUCTOR DEVICE AND METHOD OF MANUFACTURING THE SAME

(75) Inventor: Koujiro Kameyama, Ota (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 225 days.

(21) Appl. No.: 12/530,829

(22) PCT Filed: Mar. 12, 2008

(86) PCT No.: PCT/JP2008/055027
§ 371 (c)(1),
(2), (4) Date: Sep. 11, 2009

(87) PCT Pub. No.: WO2008/114806
PCT Pub. Date: Sep. 25, 2008

(65) Prior Publication Data
US 2010/0044873 A1    Feb. 25, 2010

(30) Foreign Application Priority Data
Mar. 14, 2007  (JP) ................................ 2007-065353

(51) Int. Cl.
    *H01L 21/76*    (2006.01)
(52) U.S. Cl. ......... 438/424; 438/458; 438/459; 438/464
(58) Field of Classification Search .................. None
    See application file for complete search history.

(56) References Cited

U.S. PATENT DOCUMENTS

| | | | | |
|---|---|---|---|---|
| 5,665,607 | A | * | 9/1997 | Kawama et al. ................. 438/64 |
| 7,524,024 | B2 | * | 4/2009 | Murata ............................ 347/50 |
| 2004/0092108 | A1 | | 5/2004 | Yajima et al. |
| 2004/0102025 | A1 | * | 5/2004 | Arita .............................. 438/460 |
| 2005/0170612 | A1 | | 8/2005 | Miyanari et al. |

FOREIGN PATENT DOCUMENTS

| | | | |
|---|---|---|---|
| JP | 63-261851 | | 10/1988 |
| JP | 63261851 A | * | 10/1988 |
| JP | 04-291725 | | 10/1992 |
| JP | 07-147262 | | 6/1995 |

(Continued)

OTHER PUBLICATIONS

International Search Report mailed Jun. 10, 2008, directed to International Application No. PCT/JP2008/055027; 4 pages.

*Primary Examiner* — Thomas L Dickey
*Assistant Examiner* — Scott R Wilson
(74) *Attorney, Agent, or Firm* — Morrison & Foerster LLP

(57) ABSTRACT

When a thin semiconductor device is formed by grinding a wafer, it has been necessary to dice the wafer into dies and process the back surfaces of the dies separately. In the invention, a wafer 2a is half-diced from the front surface thereof to form groove portions 4 therein, and in this state, the front surface of the wafer 2a is attached to a supporting body 5 having rigidity with an adhesive layer 6. Then, the wafer 2a is ground from the back surface and diced into individual dies 2b, and then a back surface process including a heat treatment such as the formation of back surface electrodes 9a is performed in the state where the dies 2b are attached to the supporting body 5.

14 Claims, 9 Drawing Sheets

FOREIGN PATENT DOCUMENTS

| | | |
|---|---|---|
| JP | 10-50815 | 2/1998 |
| JP | 2000-195826 | 7/2000 |
| JP | 2000-286335 | 10/2000 |
| JP | 2002-145380 | 5/2002 |
| JP | 2003-175906 | 6/2003 |
| JP | 2004-153193 | 5/2004 |
| JP | 2004-296912 | 10/2004 |
| JP | 2004-327708 | 11/2004 |
| JP | 2004327708 A * | 11/2004 |
| JP | 2005-50997 | 2/2005 |
| JP | 2005-175136 | 6/2005 |
| JP | 2005-191550 | 7/2005 |
| JP | 2006-344816 | 12/2006 |
| JP | 2007-242912 | 9/2007 |
| WO | WO-2008/018164 | 2/2008 |

* cited by examiner

SEMICONDUCTOR DEVICE AND METHOD OF MANUFACTURING THE SAME

This application is a national stage application under 35 USC 371 of International Application No. No. PCT/JP2008/055027, filed Mar. 12, 2008, which claims priority from Japanese Patent Application No. 2007-065353, filed Mar. 14, 2007, the contents of which prior application are incorporated herein by reference.

Field of the Invention

The invention relates to a semiconductor device and a method of manufacturing the same, in particular, to a semiconductor device having a thin substrate and a method of manufacturing the same.

Background of the Invention

In recent years, semiconductor devices have been increasingly thinned in order to meet a need for the reduction of on-resistance, the enhancement of packaging density and so on, and in particular, semiconductor devices having thinned substrates have been developed.

—A Method of Manufacturing a Semiconductor Device of a First Conventional Art—

First, as shown in FIG. 12, a wafer 102a having element regions 101 formed on the main front surface is provided, and a protection tape 105a is attached to the front surface of the wafer 102a.

Then, as shown in FIG. 13, the wafer 102a is fixed to a grinding fixing table 107 with the front surface down, and the wafer 102a is ground and thinned from the back surface to a desired thickness. In detail, in a case of discrete devices, the wafer 102a is ground so as to have a thickness of about 100 to 200 μm, and in a case of LSI, the wafer 102a is ground so as to have a thickness of about 150 to 330 μm. After the grinding, the protection tape 105a is removed from the wafer 102a.

Then, as shown in FIG. 14, a flat ring 105c to which a bonding tape 105b is attached is provided, and the back surface of the wafer 102a is bonded to the bonding tape 105b exposed from the flat ring 105c. Then, the flat ring 105c and the bonding tape 105b are fixed to a dicing table 103, and the wafer 102a is fully diced using a dicing blade to cut and separate the wafer 102a into individual dies 102b.

Then, as shown in FIG. 15, each of the dies 102b is picked up from the fixing tape 105b, a conductive material 113 is applied to an island 112a, and the die 102b is mounted thereon. Then, the element region 101 and a lead 112b are connected using, for example, a wire 114. The die 102b, the island 112a and the wire 114 are sealed using, for example, a resin.

However, by this manufacturing method, the wafer 102a largely warps when the wafer 102a is ground to the thickness of the die. Particularly in recent years, the diameter of the wafer 102a has been increased, and this warping is not neglectable.

Therefore, in order to prevent the wafer warping, a manufacturing method described below is disclosed.

—A Method of Manufacturing a Semiconductor Device of a Second Conventional Art—

First, as shown in FIG. 16, a wafer 202a having element regions 201 formed on the front surface side is provided, and the back surface of the wafer 202a is fixed to a dicing table 203 by vacuum suction or the like. The wafer 202a is then half-diced from the front surface to form groove portions 204.

Then, as shown in FIG. 17, a flat ring 205b to which a protection tape 205a is attached is provided. The element regions 201 are then bonded to the protection tape 205a exposed from the flat ring 205b.

Then, as shown in FIG. 18, the flat ring 205b is fixed to a grinding fixing table 207 of a grinder by suction. The wafer 202a is then ground and thinned from the back surface side to the groove portions 204. At this time, the wafer 102a is diced into individual dies 202b.

Then, each of the dies 102b is picked up from the fixing tape 105b, and a semiconductor device as shown in FIG. 15 is obtained as in the first conventional art.

As described above, in the second conventional art, since the wafer 202a is diced into each of the dies 202b by thinning the wafer 202a, the wafer 202a is prevented from warping.

Japanese Patent Application Publication No. 2000-195826 is a document disclosing a relevant technique, for example.

SUMMARY OF THE INVENTION

In the first and second conventional arts, after the wafers 102a, 202a are diced into each of the dies 102b, 202b, each of the dies 102b, 202b need be picked up and then carried to a place for performing a next process. This is because the mechanical strengths of the fixing tape 105b and the protection tape 205a are weak.

Furthermore, in the manufacturing processes described above, each of the dies 102b, 202b is mounted on the island 112a using the conductive material 113 in a state where a back surface electrode is not formed on each of the dies 102b, 202b. This is because in the first and second conventional arts the fixing tape 105b and the protection tape 205a are not resistible to a process temperature for forming back surface electrodes and thus it is difficult to form the back surface electrodes at a time in a state where the dies 102b, 202b are attached to the fixing tape 105b and the protection tape 205a respectively.

Furthermore, while the wafer 202a is diced into each of the dies 202b at the same time as the grinding in the second conventional art, it is difficult to thin the dies 202b to 80 μm or less since the mechanical strength of the protection tape 205b is weak.

To address these, a method of manufacturing a semiconductor device of the invention includes: providing a wafer having element regions formed on a front surface; forming groove portions so as to surround the element regions; attaching a supporting body having rigidity to the front surface of the wafer with an adhesive layer; dividing the wafer into a plurality of dies by thinning the wafer from the back surface to the groove portions; performing a back surface process including a heat treatment in a state where the plurality of dies is attached to the supporting body; and separating the plurality of dies by dissolving the adhesive layer, wherein the adhesive layer is applied so as to enter the groove portions.

A semiconductor device of the invention includes a semiconductor die, an element region formed on a front surface of the semiconductor die, and a back surface electrode formed on a back surface of the die, wherein the back surface electrode extends to a middle of a sidewall of the semiconductor die, and a wax material is formed to a middle of the sidewall.

The invention achieves the back surface process including the heat treatment for the back surface electrodes etc in the state where the dies are attached to the supporting body at a time.

Furthermore, the height of the side fillet is controllable by the amount of the adhesive layer entering the groove portions.

DETAILED DESCRIPTION OF THE INVENTION

Hereafter, a concrete embodiment of the invention will be described referring to figures in detail.

—Outline of a Manufacturing Method—

Figure 1:
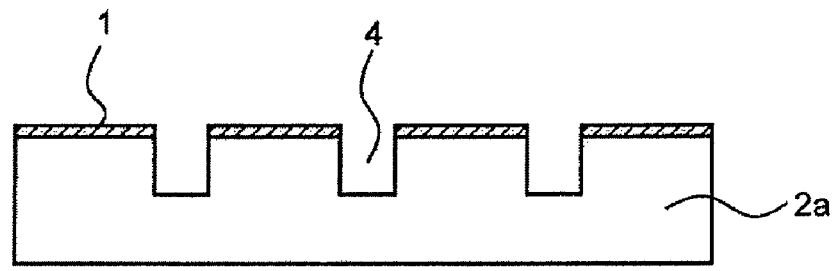
FIG. 1 is a cross-sectional view of a process of a method of manufacturing a semiconductor device of the invention.

First, as shown in FIG. 1, a wafer 2a having element regions 1 formed on the front surface side is provided, and groove portions 4 are then formed so as to surround the element regions 1. At this time, the groove portions 4 are formed at least deeper than thicknesses of completed dies.

Figure 2:
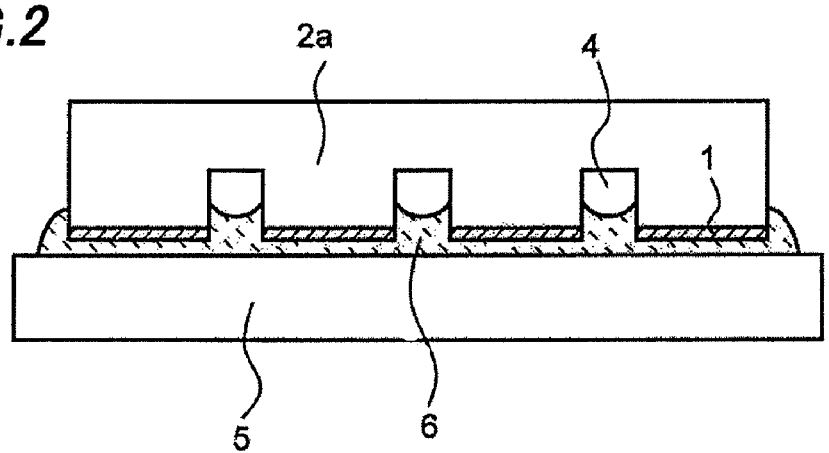
FIG. 2 is a cross-sectional view of a process of the method of manufacturing the semiconductor device of the invention.

Then, as shown in FIG. 2, the wafer 2a is attached to a supporting body 5 using an adhesive layer 6, with the element regions 1 down. A material having viscosity such as an epoxy resin, a resist, an acrylic or the like is used as the adhesive layer 6. A material having rigidity such as a glass, a quartz, a ceramic, a plastic, a metal, a resin or the like is used as the supporting body 5. It is noted that the adhesive layer 6 does not completely fill the groove portions 4 and is formed slightly shallower than the thicknesses of the completed dies.

Figure 3:
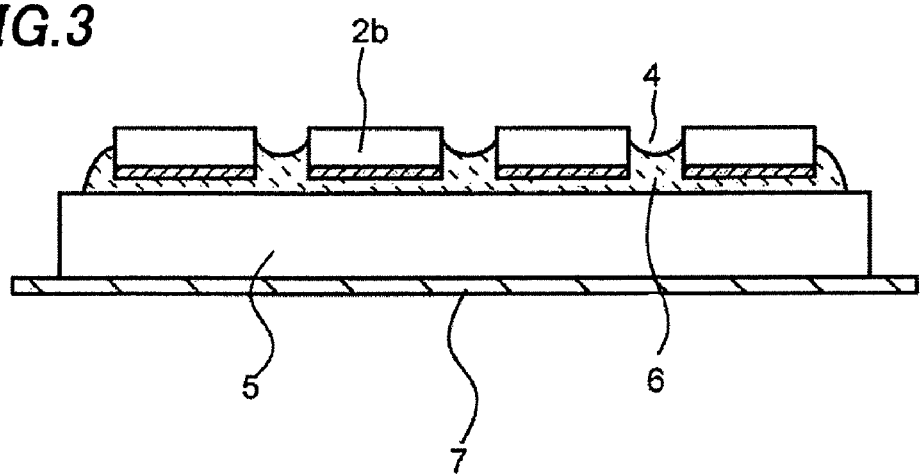
FIG. 3 is a cross-sectional view of a process of the method of manufacturing the semiconductor device of the invention.

Then, as shown in FIG. 3, a BG tape 7 is attached to the supporting body 5 and the wafer 2a is ground and thinned from the back surface side to a desired thickness (that corresponds to the thicknesses of the completed dies). At this time, the wafer 2a is ground to the groove portions 4 and diced into individual dies 2b, and the wafer 2a is firmly supported by the rigid supporting body 5. Therefore, in the embodiment, the grinding of the wafer 2a to 80 µm or less is realized. Although the groove portions 4 are exposed when the wafer 2a is diced into each of the dies 2b, grinding impurities are prevented from entering the element regions 1 through the groove portions 4 since the adhesive layer 6 is deposited in the groove portions 4.

Figure 4:
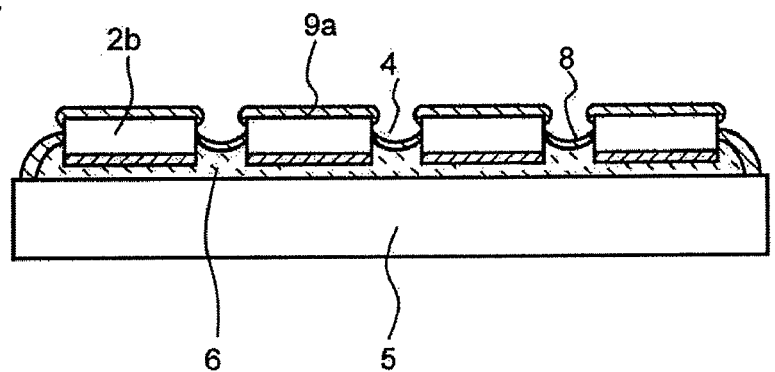
FIG. 4 is a cross-sectional view of a process of the method of manufacturing the semiconductor device of the invention.

Then, as shown in FIG. 4, by a CVD method, a PVD method, a sputtering method, a plating method or the like, an electrode material 8 such as Al, Cu or the like is deposited on the back surface sides of the dies 2b to form back surface electrodes 9a. In the embodiment, since the dies 2b are supported by the supporting body 5 having high thermal resistance, the back surface process for the dies 2b is realized at a time without removing the dies 2b from the supporting body 5.

Figure 5:
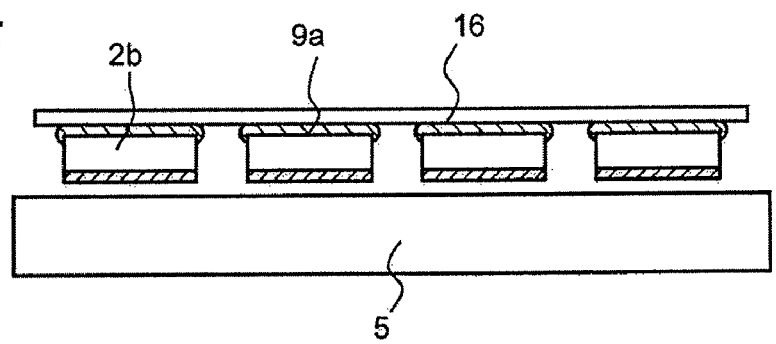
FIG. 5 is a cross-sectional view of a process of the method of manufacturing the semiconductor device of the invention.

Then, as shown in FIG. 5, the dies 2b are attached to a fixing tape 16, and then the adhesive layer 6 is dissolved to remove the dies 2b from the supporting body 5.

Figure 6:
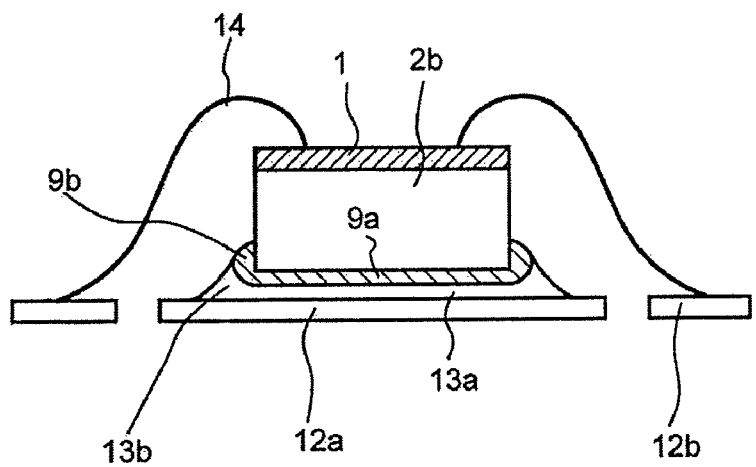
FIG. 6 is a cross-sectional view of the semiconductor device of the invention.

Then, as shown in FIG. 6, each of the dies 2b is picked up from the fixing tape 16, and mounted on an island 12a. Then, an electrode (not shown) formed in the element region 1 and a lead 12b are connected through a wire 14 such as a gold, a copper or the like. Furthermore, according to needs, the die 2b, the island 12a and the lead 12b are packaged in a resin mold, thereby providing a completed semiconductor device.

—Details About the Process of Forming the Groove Portions 4 in the Wafer 2a (FIG. 1)—

In the invention, various methods are applied as the method of forming the groove portions 4 in a wafer, as described below.

For example, the groove portions 4 may be formed by half-dicing, and in this case, the half-dicing is performed using a blade, laser or the like. Particularly by the half-dicing using laser, even when a layer having low mechanical strength such as a low-k (low dielectric constant) material or the like is formed on the wafer 2a, this layer is prevented from peeling.

The groove portions 4 may be formed by etching such as isotropic etching, anisotropic etching or the like. This case makes it possible to form the groove portions 4 so as to have a shape such that the electrode material 8 is hardly attached to the sidewalls of the groove portions.

Figure 7A:
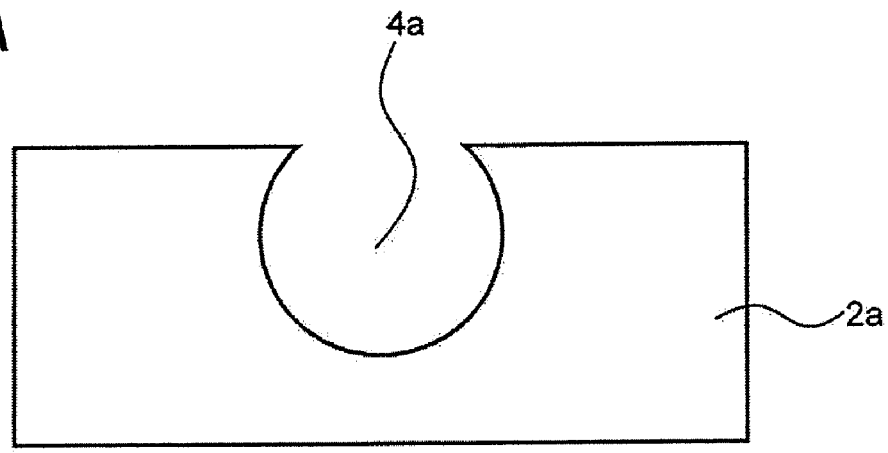
FIG. 7 is cross-sectional views of a process of the method of manufacturing the semiconductor device of the invention.
Figure 7B:
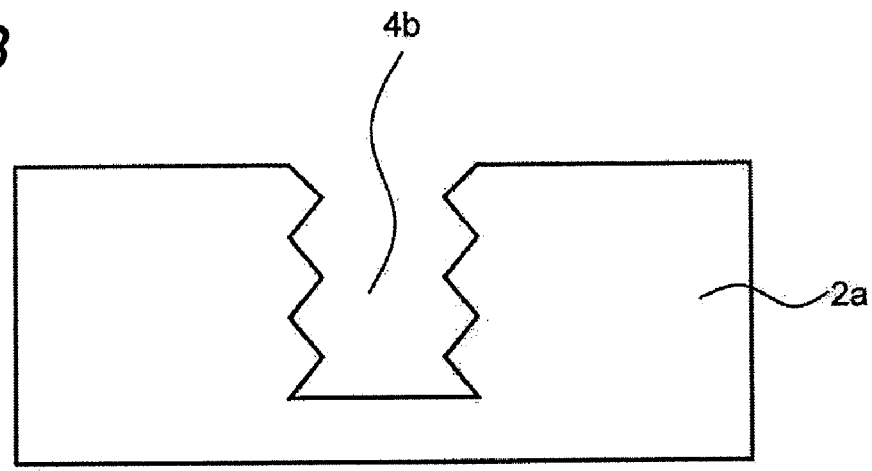

In detail, as shown in FIG. 7(a) (an enlarged view of the groove portion 4a and a portion therearound), by using isotropic etching, the groove portions 4a are formed to curve so that the upper end portions are narrowed. At this time, the electrode material 8 is hardly attached to the sidewalls of the groove portions 4a. Furthermore, as shown in FIG. 7(b), by a method of alternately repeating a plasma etching process mainly using a SF6 gas as anisotropic etching and a plasma deposition process mainly using a C4F8 gas, the groove portions 4b are formed so that the inner sidewalls are rough and waved. At this time, the electrode material is discontinuously attached to the inner sidewalls of the groove portions 4b.

—Details About the Process of Attaching the Supporting Body 5 to the Wafer 2a (FIG. 2)—

In the embodiment described above, the back surface electrodes 9a are formed in the state where the dies 2b are attached to the supporting body 5 (FIG. 4). At this time, when the groove portions 4 are completely filled with the adhesive layer 6, the electrode material 8 is continuously formed on the dies 2a and on the adhesive layer 6 exposed from the groove portions 4, and in the dissolving process of the adhesive layer 6 (FIG. 5) the adhesive layer 6 is not dissolved since the dies 2b are connected by the electrode material 8. Therefore, it is necessary to form the adhesive layer 6 having a smaller thickness than the thicknesses of the completed dies 2b.

Therefore, it is preferable that the adhesive layer 6 is applied to the supporting body 5 first and then these are attached to the wafer 2a. This makes it possible to push the adhesive layer 6 by the air accumulated in the groove portions 4, and thus the adhesive layer 6 hardly fills the groove portions 4 completely.

On the other hand, when the adhesive layer 6 is applied to the wafer 2a first and then attached to the supporting body 5, the adhesive layer 6 enters the groove portions 4 at the time when the adhesive layer 6 is applied to the wafer 2a. Therefore, the adhesive layer 6 tends to fill the groove portions 4 more easily than by the method described above. Accordingly, the method described above is effective when the wettability of the groove portions 4 is large such as when the groove portions 4 have small diameters.

—Details About the Process of Grinding the Wafer 2a (FIG. 3)—

In the embodiment described above, the wafer 2a is diced into each of the dies 2b at the same time as the grinding. After then, the dies 2b are carried to a place for performing a next process in the state where the dies 2b are attached to the supporting body 5, but at this time the end portions of the dies 2b on the back surface easily chip. In order to prevent this, a process of rounding the end portions of the dies 2b may be added. In detail, after the wafer 2a is ground, the back surface of the wafer 2a is slightly etched using, for example, acid (e.g. a mixture of HF and nitric acid or the like) as an etchant.

—Details About the Process of Forming the Back Surface Electrodes 9a (FIG. 4)—

In the embodiment described above, the dies 2b are removed from the supporting body 5 by dissolving the adhesive layer 5 (FIG. 5), and this is realized by the electrode material 8 that is formed discontinuously on the dies 2b and on the adhesive layer. Hereafter, the discontinuity of the electrode material 8 will be described in detail.

Figure 8A:
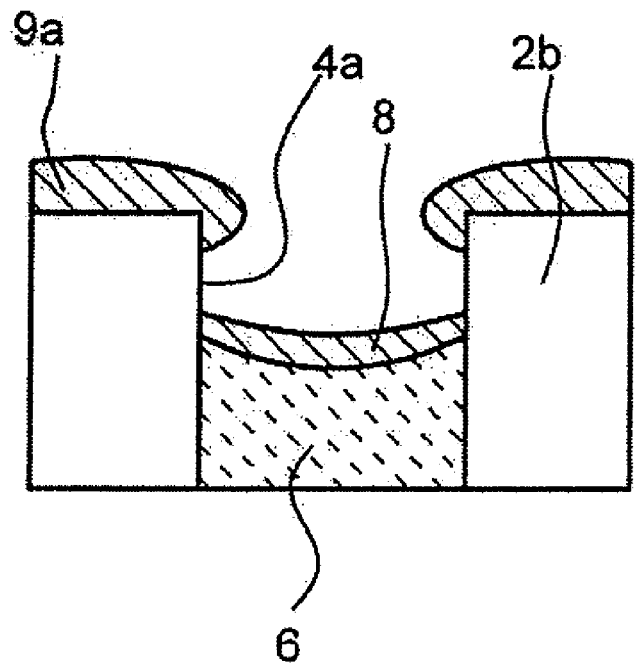
FIG. 8 is cross-sectional views of a process of the method of manufacturing the semiconductor device of the invention.
Figure 8B:
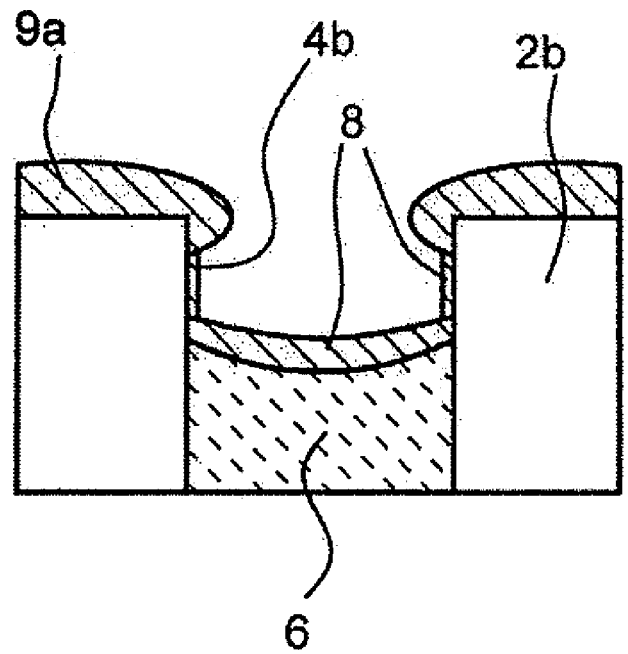

FIGS. 8(a), (b) show enlarged cross-sectional views of the groove portion 4 and a portion therearound. In the embodiment, since the back surface electrodes 9a are formed not only on the back surfaces of the dies 2b but also onto the upper ends of the sidewall portions thereof, these serve as umbrellas and thus the electrode material 8 is hardly attached to the sidewall portions 4a, 4b of the dies 2b. Therefore, the electrode material 8 is not formed on the sidewall portions 4a at all as shown in FIG. 8(a), or formed thin on the sidewall portions 4b as shown in FIG. 8(b).

Furthermore, since the adhesive layer 6 is deposited in the groove portions 4, the electrode material 8 is formed not reaching the element regions 1, and thus a defect such as short-circuit or the like hardly occurs.

—Details About the Process of Dissolving the Adhesive Layer (FIG. 5)—

In order to dissolve the adhesive layer 6, it is necessary to mix a resolvent 17 in the adhesive layer 6, and a concrete example will be described below.

Figure 9A:
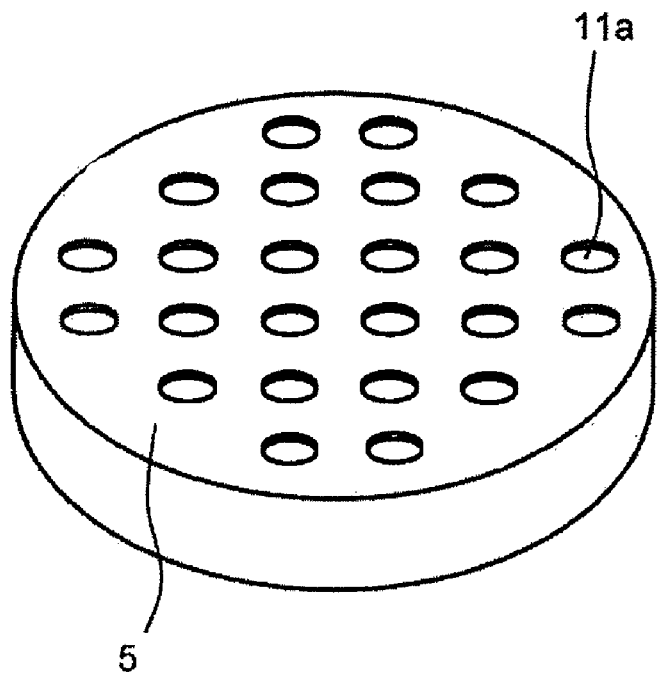
FIG. 9 is cross-sectional views of a process of the method of manufacturing the semiconductor device of the invention.
Figure 9B:
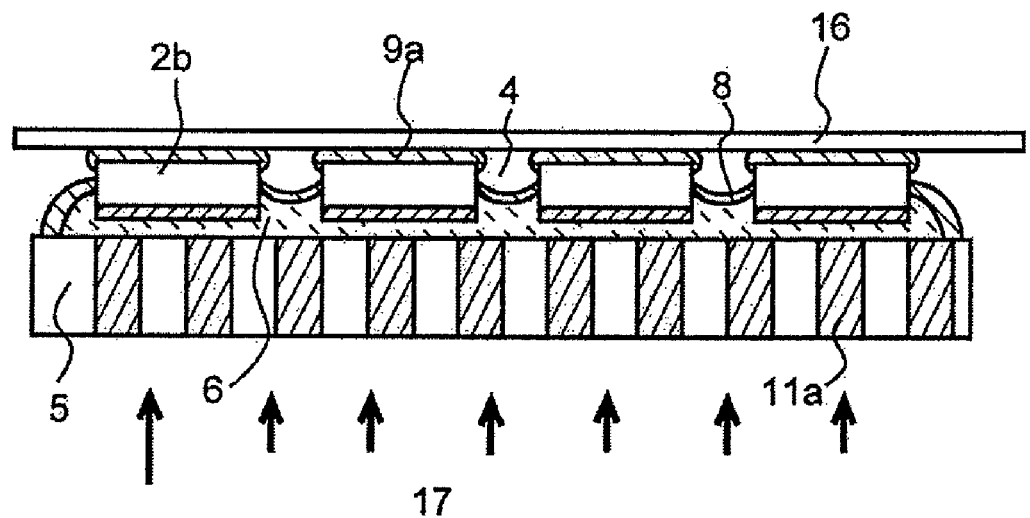

The supporting body 5 shown in FIG. 9(a) has dissolution holes 11a for supplying the resolvent 17. By using this supporting body 5, as shown in FIG. 9(b), the fixing tape 16 is attached to the back surfaces of the dies 2b, and the resolvent 17 is supplied through the dissolution holes 11a to dissolve the adhesive layer 6 and remove the dies 2b from the supporting body 5.

Figure 10A:
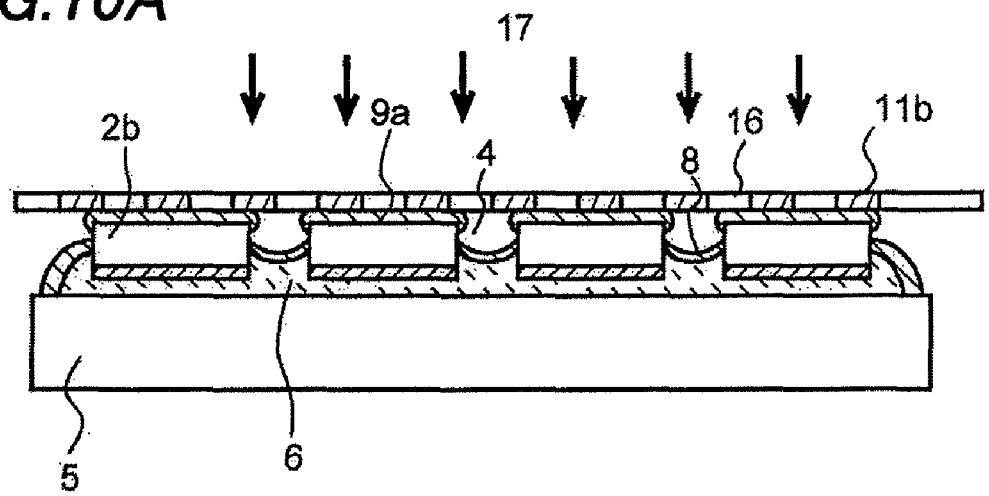
FIG. 10 is cross-sectional views of a process of the method of manufacturing the semiconductor device of the invention.

Furthermore, in FIG. 10(a), dissolution holes 11b for supplying the resolvent 17 are formed in the fixing tape 16. Therefore, the resolvent 17 is supplied through the dissolution holes 11b of the fixing tape 16 to remove the dies 2b from the supporting body 5.

Figure 10B:
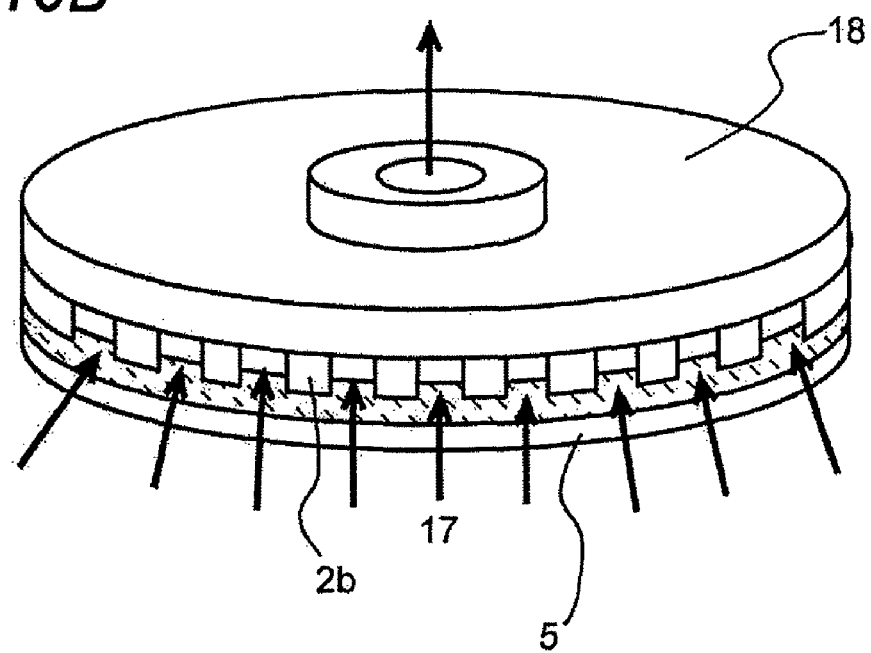

Furthermore, in FIG. 10(b), the dies 2b are fixed by suction using a suction device 18. In this case, the resolvent 17 is sucked and thus supplied to the adhesive layer 6 through, for example, spaces between the sidewalls of the groove portions 4.

—Details About the Structure of the Semiconductor Device (FIG. 6)—

In the embodiment described above, the back surface electrodes 9a are formed not only on the back surfaces of the dies 2b but also onto the sidewalls. Therefore, by connecting the back surface electrode 9a and the island 12a using the conductive material 13a such as a solder or the like and performing a reflow treatment thereto, the conductive material 13a flows toward the outside of the die 2b. Therefore, the conductive material 13a forms a side fillet 13b, and the die 2b and the island 12a are firmly connected.

—Carrying the Wafer 2a—

In general, in manufacture of semiconductor devices, all processes are not performed at same place, and, for example, front-end processes are performed in Japan and back-end processes are performed in Asia. In particular, the process of processing the wafer 2a and the process of mounting the die 2b are often performed at different places.

In this regard, in the invention, after the wafer 2a is processed, the dies 2b are carried in the state where these are attached to the supporting body 5.

Figure 11:
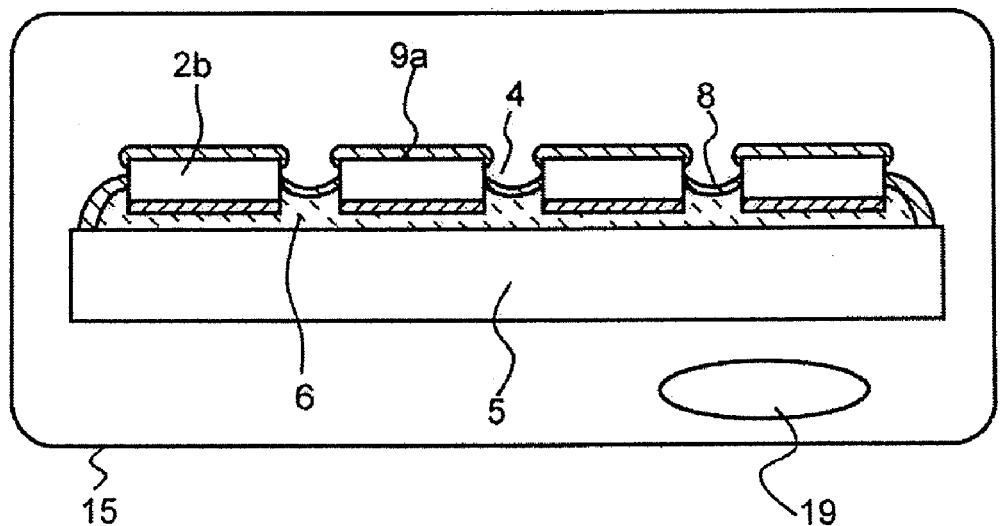
FIG. 11 is a cross-sectional view of a process of the method of manufacturing the semiconductor device of the invention.
Figure 12:
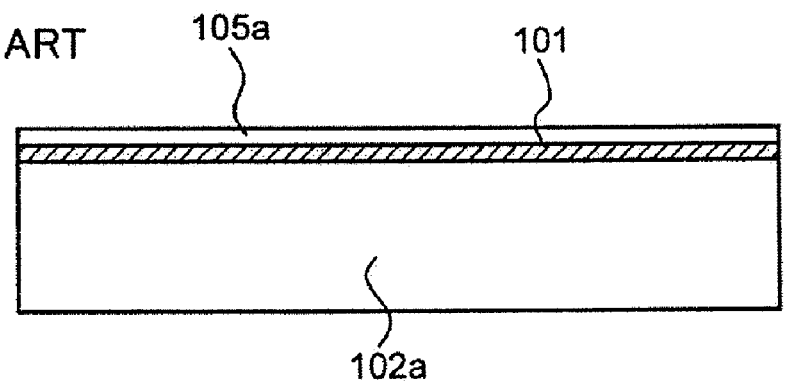
FIG. 12 is a cross-sectional view of a process of a method of manufacturing a semiconductor device of a conventional art.
Figure 13:
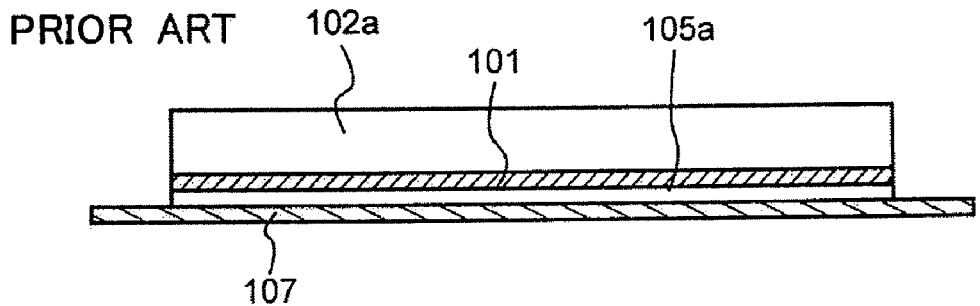
FIG. 13 is a cross-sectional view of a process of the method of manufacturing the semiconductor device of the conventional art.
Figure 14:
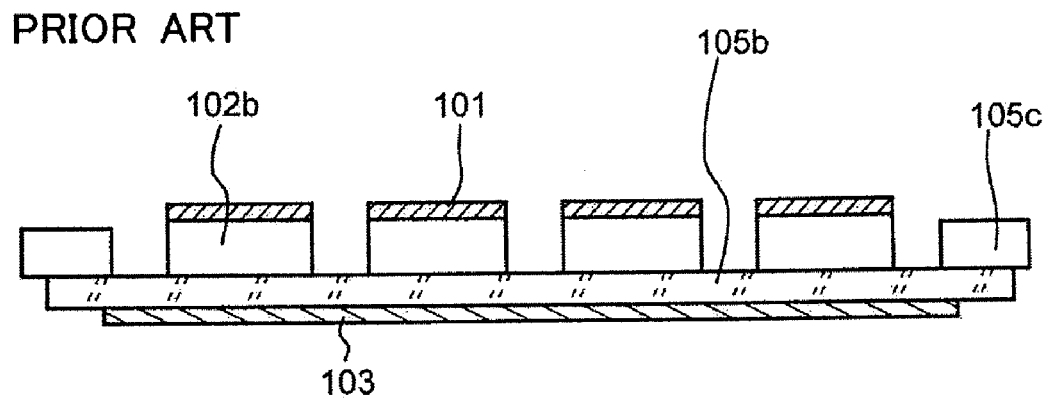
FIG. 14 is a cross-sectional view of a process of the method of manufacturing the semiconductor device of the conventional art.
Figure 15:
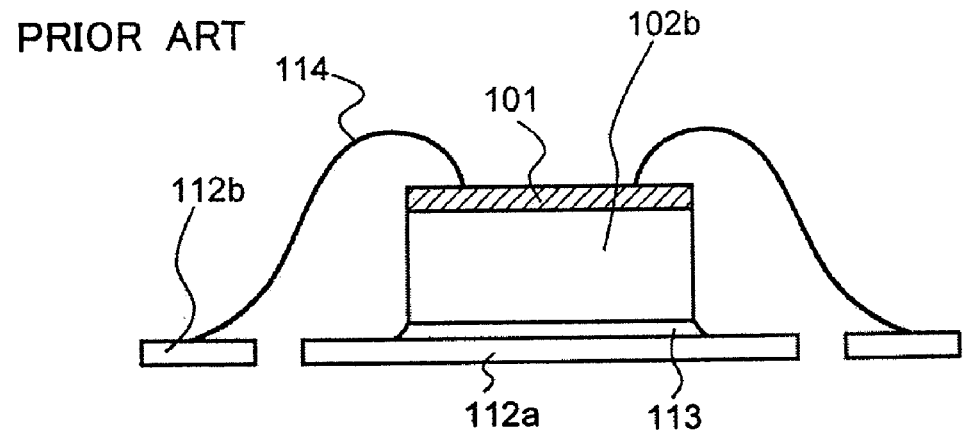
FIG. 15 is a cross-sectional view of the semiconductor device of the conventional art.
Figure 16:
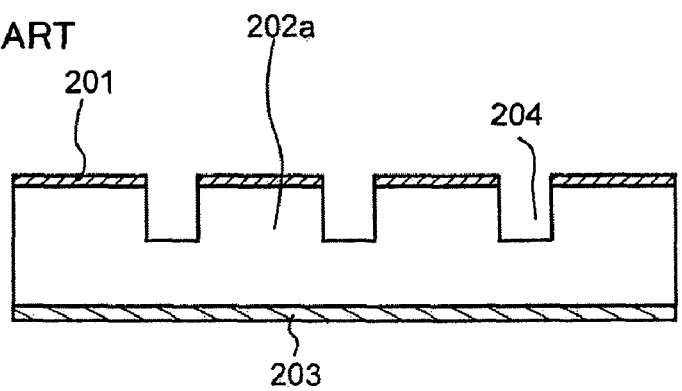
FIG. 16 is a cross-sectional view of a semiconductor device of a conventional art.
Figure 17:
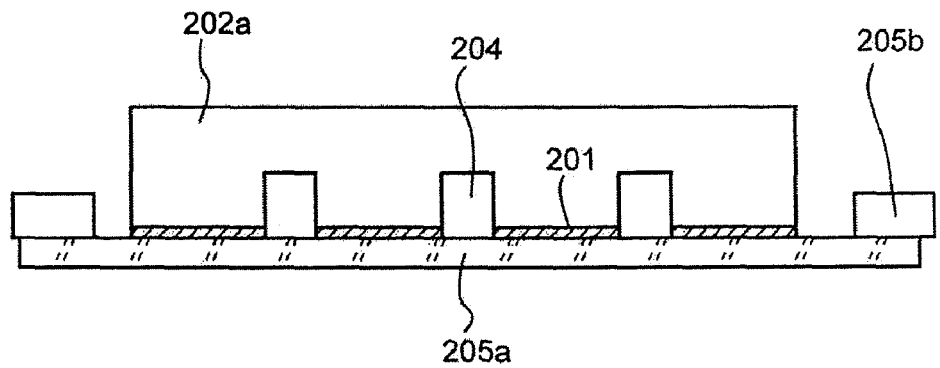
FIG. 17 is a cross-sectional view of a process of a method of manufacturing the semiconductor device of the conventional art.
Figure 18:
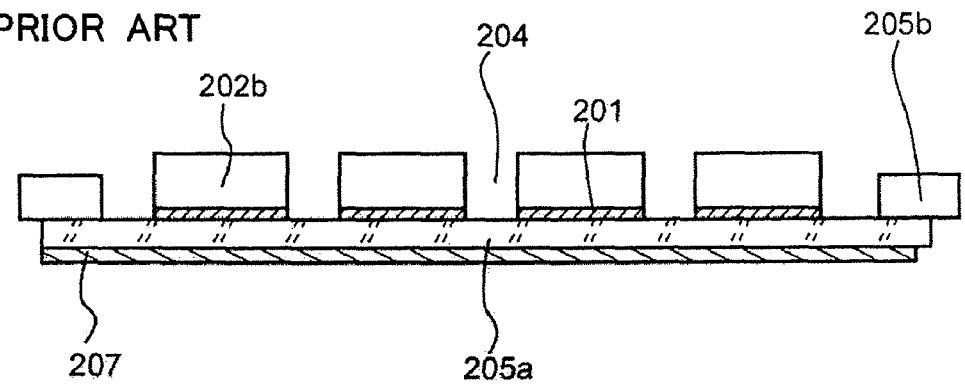
FIG. 18 is a cross-sectional view of a process of the method of manufacturing the semiconductor device of the conventional art.

In detail, as shown in FIG. 11, after the back surface electrodes 9a are formed on the dies 2b, these are packaged in a carriage case 15 and carried to a place for performing other process.

This is realized because the supporting body 5 has rigidity and the wafer 2a is diced into dies and thus warping hardly occurs.

Furthermore, in the groove portions 4, the adhesive layer 6 is covered by the electrode material 8. Therefore, moisture in the air is hardly mixed in the adhesive layer 6 during the carrying, and a problem such that the dies 2b peel off during the carrying hardly occurs.

Various things such as a laminate bag, a solid box or the like are used as the carriage case 15. By placing a desiccant 19 for absorbing moisture in the air in the carriage case 15, the peeling of the adhesive layer 6 is more prevented.

It should be understood that the embodiment described here is illustrative and not limitative in all aspects. The scope of the invention is determined by the claims and not by the above description of the embodiment, and a relevant spirit to the claims and all modifications within the scope of the claims are included.

For example, the invention is not limited by the type of the die 2b, and applicable to various semiconductor devices such as LSI etc as well as a discrete device such as a MOS transistor, IGBT, a diode, etc.

What is claimed is:

1. A method of manufacturing a semiconductor device, comprising:

providing a wafer comprising element regions formed on a main surface thereof;

forming a plurality of groove portions in the main surface of the wafer so as to surround the element regions;

attaching a supporting body having rigidity to the main surface of the wafer with an adhesive layer so that the adhesive layer enters the groove portions so as not fill the groove portions completely;

dividing the wafer into a plurality of dies by thinning the wafer from another main surface thereof so as to expose the groove portions, each die comprising a corresponding element region;

performing a back surface process comprising a heat treatment to the another main surface of the wafer that is divided into the plurality of dies and attached to the supporting body; and separating the plurality of dies by dissolving the adhesive layer.

2. The method of claim 1, wherein the back surface process comprises forming back surface electrodes on the another main surfaces of the wafer.

3. The method of claim 2, further comprising mounting one of the dies on an island, wherein the back surface electrode is bonded to the island using a conductive material so that the conductive material forms a side fillet corresponding to a shape of the back surface electrode on a sidewall of the die.

4. The method of claim 1, wherein the supporting body comprises a glass, a quartz, a ceramic, a plastic, a metal or a resin.

5. The method of claim 1, wherein the dies are thinned to 80μm or less.

6. The method of claim 1, wherein the adhesive layer comprises an epoxy resin, a resist, or an acrylic resin.

7. The method of claim 1, wherein the wafer and the supporting body are attached to each other after the adhesive layer is applied to the supporting body.

8. The method of claim 1, wherein the wafer and the supporting body are attached to each other after the adhesive layer is applied to the wafer, and the adhesive layer enters the groove portions without prevented by wettability.

9. The method of claim 1, wherein dissolution holes are formed in the supporting body, and the adhesive layer is removed by a resolvent injected through the dissolution holes.

10. The method of claim 1, wherein the plurality of dies is fixed by a suction device and then a resolvent is sucked through the groove portions to dissolve the adhesive layer.

11. The method of claim 1, further comprising attaching the another main surface of the wafer that has gone through the back surface process to a fixing tape.

12. A method of manufacturing a semiconductor device, comprising:
  providing a wafer comprising element regions formed on a main surface thereof;
  forming a plurality of groove portions in the main surface of the wafer so as to surround the element regions;
  attaching a supporting body having rigidity to the main surface of the wafer with an adhesive layer so that the adhesive layer enters the groove portions;
  dividing the wafer into a plurality of dies by thinning the wafer from another main surface thereof so as to expose the groove portions, each die comprising a corresponding element region;
  performing a back surface process comprising a heat treatment to the another main surface of the wafer that is divided into the plurality of dies and attached to the supporting body; and
  attaching the plurality of dies to a fixing tape, wherein
  the fixing tape comprises openings and the adhesive layer is dissolved by a resolvent injected through the openings of the fixing tape.

13. A semiconductor device comprising:
  a semiconductor die;
  an element region formed on a main surface of the semiconductor die;
  a back surface electrode formed on another main surface of the die;
  an island bonded to the back surface electrode using a conductive material; and
  a lead connected through a wire to an electrode formed in the element region on the main surface of the die,
  wherein the back surface electrode bends to cover a portion of a sidewall of the semiconductor die, and a side fillet made of the conductive material is formed corresponding to a shape of the back surface electrode on the sidewall of the die.

14. The semiconductor device of claim 13, wherein a thickness of the die is 80μm or less.

* * * * *